United States Patent
Xu et al.

(10) Patent No.: US 11,047,037 B2
(45) Date of Patent: Jun. 29, 2021

(54) CONDUCTIVE THIN FILM COMPOSITE

(71) Applicant: Saint-Gobain Performance Plastics Corporation, Solon, OH (US)

(72) Inventors: Wentao Xu, San Diego, CA (US); Fabien Lienhart, San Diego, CA (US)

(73) Assignee: SAINT-GOBAIN PERFORMANCE PLASTICS CORPORATION, Solon, OH (US)

( * ) Notice: Subject to any disclaimer, the term of this patent is extended or adjusted under 35 U.S.C. 154(b) by 120 days.

(21) Appl. No.: 15/167,142

(22) Filed: May 27, 2016

(65) Prior Publication Data

US 2016/0349202 A1 Dec. 1, 2016

Related U.S. Application Data

(60) Provisional application No. 62/167,091, filed on May 27, 2015.

(51) Int. Cl.
| | |
|---|---|
| *C23C 14/20* | (2006.01) |
| *C23C 14/34* | (2006.01) |
| *G01N 27/327* | (2006.01) |

(52) U.S. Cl.
CPC ............ *C23C 14/205* (2013.01); *C23C 14/34* (2013.01); *G01N 27/3272* (2013.01)

(58) Field of Classification Search
CPC .... C23C 14/205; C23C 14/34; G01N 27/3272
See application file for complete search history.

(56) References Cited

U.S. PATENT DOCUMENTS

| | | | |
|---|---|---|---|
| 5,763,063 | A | 6/1998 | Pass et al. |
| 6,204,480 | B1 | 3/2001 | Woodard et al. |
| 6,274,447 | B1 | 8/2001 | Takasou |
| 7,291,251 | B2 | 11/2007 | Butz et al. |
| 7,311,975 | B2 | 12/2007 | Butz et al. |

(Continued)

FOREIGN PATENT DOCUMENTS

| | | |
|---|---|---|
| CN | 1632554 A | 6/2005 |
| EP | 1152239 A1 | 11/2001 |

(Continued)

OTHER PUBLICATIONS

PET Plastic: polyethylene terephthalate uses properties structure (Year: 2020).*

(Continued)

*Primary Examiner* — Luan V Van
*Assistant Examiner* — Caitlyn Mingyun Sun
(74) *Attorney, Agent, or Firm* — Abel Schillinger, LLP; Chi Suk Kim

(57) ABSTRACT

Embodiments of the present disclosure are directed to thin conductive composites, such as biosensor electrodes, containing a polymeric film substrate a conductive layer disposed adjacent the substrate. The conductive layer includes Krypton and a conductive material. The conductive layer has an average thickness of no greater than about 150 nanometers. The conductive layer has a normalized thickness $(t/\lambda)$ of no greater than about 3.0. Further, the composite has a sheet resistance of no greater than about $97.077t^{-1.071}$ ohm/sq, where t represents the thickness of the conductive layer in nanometers.

18 Claims, 3 Drawing Sheets

(56) References Cited

U.S. PATENT DOCUMENTS

| | | | |
|---|---|---|---|
| 7,387,714 B2* | 6/2008 | Gundel | G01N 27/3272 |
| | | | 204/400 |
| 8,173,278 B2 | 5/2012 | Cremer | |
| 8,216,933 B2 | 7/2012 | Wang et al. | |
| 8,349,157 B2 | 1/2013 | Miyazaki et al. | |
| 8,480,866 B2 | 7/2013 | Miyazaki et al. | |
| 2003/0024808 A1 | 2/2003 | Donohue et al. | |
| 2004/0178066 A1* | 9/2004 | Miyazaki | C12Q 1/001 |
| | | | 204/403.01 |
| 2005/0133367 A1 | 6/2005 | Hsiung et al. | |
| 2009/0053882 A1 | 2/2009 | Wang et al. | |
| 2009/0220777 A1 | 9/2009 | Sporn | |
| 2012/0118735 A1 | 5/2012 | Kim et al. | |
| 2014/0311903 A1* | 10/2014 | Setford | G01N 27/3272 |
| | | | 204/400 |

FOREIGN PATENT DOCUMENTS

| | | | |
|---|---|---|---|
| JP | H07258827 A | 10/1995 | |
| JP | H08153722 A | 6/1996 | |
| JP | H09321304 A | 12/1997 | |
| JP | H1036961 A | 2/1998 | |
| JP | 2001029267 A | 10/2001 | |
| JP | 2002279835 A | 9/2002 | |
| JP | 2008213059 A | 9/2008 | |
| JP | 2009534524 A | 9/2009 | |
| KR | 100213402 B1 | 8/1999 | |
| KR | 20010101855 A | 11/2001 | |
| WO | 01/73153 A1 | 10/2001 | |
| WO | WO 01/73153 A1 * | 10/2001 | C23C 14/16 |
| WO | 2010103097 A1 | 9/2010 | |
| WO | 2013052092 A1 | 4/2013 | |
| WO | 2014070383 A1 | 5/2014 | |

OTHER PUBLICATIONS

International Search Report and Written Opinion for PCT Application No. PCT/US2016/034678, dated Sep. 7, 2016, 16 pages.

Meyer, Francoise et al., "Ion beam sputtering deposition of tungsten: Energy and mass effects of primary ions," Applied Surface Science, 1989, pp. 286-294, vol. 38, No. 1-4.

Nagawaka, S. et al., "Methods to control internal stress in Co—Cr sputtered films on polymer tape for curl-free recording tape," Journal of Magnetism and Magnetic Materials, Jun. 1, 1994, pp. 354-361, vol. 134, No. 2-3, Elsevier, Amsterdam, NL.

Vergöhl, M. et al., "Optimization of the reflectivity of magnetron sputter deposited silver films," Journal of Vacuum Science and Technology: Part A, Jul. 1, 2000, pp. 1632-1637, vol. 18, No. 4, Melville, N.Y., US.

Datta, D. et al., "Role of interface modifications in ion-sputtering mechanism of gold thin films," Nuclear Instruments & Methods in Physics Research. Section B: Beam Interactions with Materials, and A, Dec. 1, 2003, pp. 201-205, vol. 212, Elsevier BV, NL.

Walker, C. T. et al.: "SIMs analysis of an UO2 fuel irradiated at low temperature to 65MWd/kgHM," Journal of Nuclear Materials, Sep. 1, 2009, pp. 212-223, vol. 393, No. 2, Elsevier, B.V, Netherlands.

Winters, Harold F. et al: "Gas Incorporation into Sputtered Films," Journal of Applied Physics, Sep. 1, 1967, pp. 3928-3934, vol. 38, No. 10, US.

* cited by examiner

CONDUCTIVE THIN FILM COMPOSITE

CROSS-REFERENCE TO RELATED APPLICATION(S)

This application claims priority to U.S. Provisional Patent Application No. 62/167,091, filed May 27, 2015, entitled "Conductive Thin Film Composite," naming inventors Wentao Xu and Fabien Lienhart, which is incorporated herein by reference in its entirety.

FIELD OF THE DISCLOSURE

The present disclosure relates to conductive thin film composites, and more particularly to, conductive thin film composites useful in as a biosensor electrode.

BACKGROUND

Thin film composites, such as those used in biosensors electrodes typically employ a conductive layer atop a flexible substrate. Often the conductive layer can include a precious metal.

As the price of precious metals increases efforts have been placed to decrease the amount of precious metals in the thin film composites. To date, such efforts have been unsuccessful in decreasing the amount of precious metals used without detrimentally impacting the conductivity or other material properties of the thin film composite.

Furthermore, compounding the problem, conductive layers behave differently at low thickness, making predicting successful approaches that worked with thicker layers very difficult or even impossible. For example, conductive layers having a thickness of less than 100 nanometers, and particularly less than 60 nanometers, behave quite differently than thicker layers in many material properties.

Surprisingly, the present inventors where able to significantly lower the thickness of the conductive layer, and thus the amount of precious metal material used without sacrificing performance in a number of parameters including conductivity, abrasion resistance, adhesion, density, corrosion resistance, electrochemical performance, and combinations thereof.

BRIEF DESCRIPTION OF THE DRAWINGS

Embodiments are illustrated by way of example and are not limited in the accompanying figures.

Skilled artisans appreciate that elements in the figures are illustrated for simplicity and clarity and have not necessarily been drawn to scale. For example, the dimensions of some of the elements in the figures may be exaggerated relative to other elements to help to improve understanding of embodiments of the invention.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings. However, other embodiments can be used based on the teachings as disclosed in this application.

The terms "comprises," "comprising," "includes," "including," "has," "having" or any other variation thereof, are intended to cover a non-exclusive inclusion. For example, a method, article, or apparatus that comprises a list of features is not necessarily limited only to those features but may include other features not expressly listed or inherent to such method, article, or apparatus. Further, unless expressly stated to the contrary, "or" refers to an inclusive-or and not to an exclusive-or. For example, a condition A or B is satisfied by any one of the following: A is true (or present) and B is false (or not present), A is false (or not present) and B is true (or present), and both A and B are true (or present).

Also, the use of "a" or "an" is employed to describe elements and components described herein. This is done merely for convenience and to give a general sense of the scope of the invention. This description should be read to include one, at least one, or the singular as also including the plural, or vice versa, unless it is clear that it is meant otherwise. For example, when a single item is described herein, more than one item may be used in place of a single item. Similarly, where more than one item is described herein, a single item may be substituted for that more than one item.

Unless otherwise defined, all technical and scientific terms used herein have the same meaning as commonly understood by one of ordinary skill in the art to which this invention belongs. The materials, methods, and examples are illustrative only and not intended to be limiting. To the extent not described herein, many details regarding specific materials and processing acts are conventional and may be found in textbooks and other sources within the conductive thin film arts.

The present disclosure is directed to conductive thin film composites having an improved conductivity at very low thicknesses. The concepts are better understood in view of the embodiments described below that illustrate and do not limit the scope of the present invention.

Figure 1:
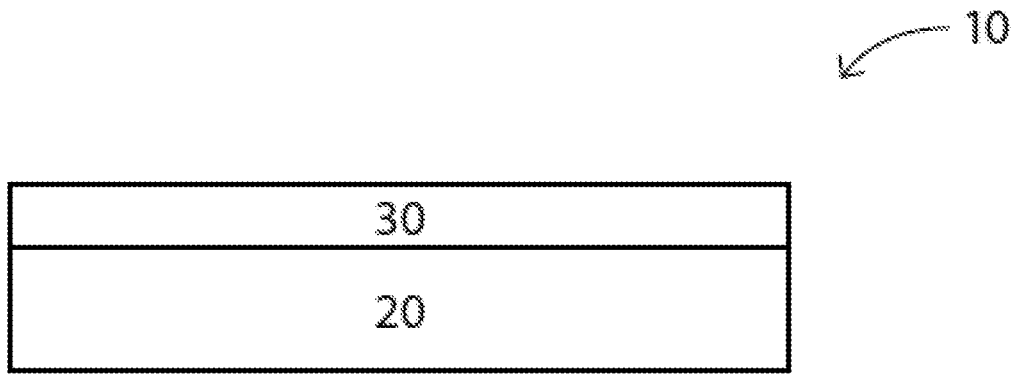
FIG. 1 includes an illustration of a thin conductive composite according to one embodiment of the present disclosure.

Referring now to FIG. 1, one aspect of the disclosure is directed to a conductive thin film composite 10, such as a conductive thin film composite for a biosensor electrode. The conductive composite 10 can include a substrate 20 and a conductive layer 30 disposed adjacent the substrate 20. In particular embodiments, such as illustrated in FIG. 1, the conductive composite 10 can consist essentially of the substrate 20 and the conductive layer 30, where the conductive layer 30 is directly adjacent and contacting the substrate layer 20.

The substrate can include any substrate material useful for making a conductive thin film composite. In particular embodiments, the substrate can include a polymeric film.

For example, suitable polymeric films can include a polyolefin, such as a polyester, a polycarbonate, a polyimide, or a combination thereof. Further, in particular embodiments, suitable polymeric films can be described as thermoplastic polymer films. In very particular embodiments, the substrate can include a polyester film, such as a polyethylene terephthalate (PET).

The substrate layer can have a desirably low thickness. For example, in particular embodiments, the substrate layer can have a thickness of no greater than about 500 microns, no greater than about 400 microns, or even no greater than about 350 microns. In further embodiments, the substrate layer can have a thickness of at least about 1 micron, at least about 12 microns, or even at least about 100 microns. Moreover, the substrate layer can have a thickness in a range of from about 12 microns to about 500 microns, or even from about 100 microns to about 350 microns.

In particular embodiments, the substrate can be heat treated prior to application of the conductive layer. Heat treatment can reduce shrinkage and/or improve thermal stability during the conductive layer deposition process. In other embodiments, the substrate can not be heat treated.

Referring again to FIG. 1, the conductive thin film composite 10 includes a conductive layer 30.

In the broadest embodiments, the conductive layer can include any desirable conductive material. In particular embodiments, the conductive layer can include a conductive material such as aluminum, carbon (such as graphite), cobalt, copper, gold, indium, iridium, iron, magnesium, nickel, niobium, osmium, palladium, platinum, rhenium, rhodium, selenium, silver, tantalum, tin, titanium, tungsten, vanadium, zirconium, mixtures thereof, or alloys, oxides, or metallic compounds of these elements.

In very particular embodiments, the conductive material can include a precious metal.

In still further particular embodiments, the conductive material can include gold, palladium, or a combination thereof. In certain embodiments, the conductive material can include or even consist essentially of gold. In other embodiments, the conductive material can include or even consist essential of palladium.

In addition to the conductive material, the conductive layer can further include sputtered atoms from a sputtering gas. For example, the conductive layer can include argon, krypton, xenon, neon, or a combination thereof. In particular embodiments, the conductive layer can include krypton. In further embodiments, the conductive layer can include krypton and another element such as argon and/or xenon. In very particular embodiments, the conductive layer can consists essentially of the conductive material and krypton. In still further particular embodiments, the conductive layer can consists essentially of gold and/or palladium and krypton.

As will be discussed in more detail below, particular embodiments of the present disclosure include methods of forming conductive thin film composites, which can include a unique sputtering process. A result of the sputtering process includes the incorporation of sputtered atoms described above from the sputtering gas packed between the atoms of the conductive material.

In fact, a particular advantage of certain embodiments of the present disclosure is the use of krypton as the sputtering gas and thus incorporation of krypton into the formed conductive layer, particularly for thin film biosensor electrodes. As demonstrated in the Examples below, incorporation of krypton as the sputtering gas in very thin conductive composites exhibited significant and unexpected benefits in properties such as conductivity, abrasion resistance, adhesion, density, corrosion resistance, electrochemical performance, and combinations thereof. These substantial improvements have enabled the creation of thin conductive composites to achieve unparalleled performances as a function of thickness of the conductive layer. For example, equivalent performance to the state of the art can be maintained while using a substantially lower amount of conductive material (i.e. reduced thickness).

Secondary ion mass spectrometry (SIMS) as is well understood in the art, was employed to detect and quantify the content and composition of sputtered atoms at varying depths of the conductive layer. With this capability, the current inventors were able to develop a unique sputtering process that controls the content of sputtered atoms through the thickness of the conductive layer.

In very particular embodiments, the sputtered non-conductive atoms can be present in the conductive layer in an amount of at least about $1 \times 10^{10}$ Atoms/cm$^3$, at least about $1 \times 10^{12}$ Atoms/cm$^3$, at least about $1 \times 10^{14}$ Atoms/cm$^3$, at least about $1 \times 10^{16}$ Atoms/cm$^3$, at least about $1 \times 10^{18}$ Atoms/cm$^3$, or even at least about $1 \times 10^{19}$ Atoms/cm$^3$ at a depth of about 5 nanometers as measured according to SIMS. Moreover, the conductive layer can have the above recited content of sputtered non-conductive atoms at a depth of about 5 nanometers, about 10 nanometers, about 20 nanometers, about 30 nanometers, about 40 nanometers, about 50 nanometers, about 60 nanometers, or even about 70 nanometers as measured according to SIMS.

As described throughout this document, the conductive layer can have a desirably low thickness. For example, in particular embodiments, the conductive layer can have a thickness of no greater than about 150 nanometers, no greater than about 125 nanometers, no greater than about 100 nanometers, no greater than about 80 nanometers, no greater than about 70 nanometers, no greater than about 60 nanometers, no greater than about 50 nanometers, no greater than about 40 nanometers, no greater than about 30 nanometers, no greater than about 25 nanometers, or even no greater than about 20 nanometers. In particular embodiments, the conductive layer can have a thickness of no greater than 100 nanometers. In very particular embodiments, the conductive layer can have a thickness of no greater than 80 nanometers. In still very particular embodiments, the conductive layer can have a thickness of no greater than about 40 nanometers. In further embodiments, the conductive layer can have a thickness of at least about 0.1 nanometers, at least about 0.5 nanometers, at least about 1 nanometer, at least about 3 nanometers, at least about 5 nanometers, or even at least about 10 nanometers. Moreover, the conductive layer can have a thickness in a range of any of the minimums and maximums provided above, such as in a range of from about 3 nanometers to about 150 nanometers, or even from about 5 nanometers to about 100 nanometers.

Similarly, the conductive layer can have a desirably low normalized thickness. The normalized thickness of the conductive layer refers to $t/\lambda$, where $t$ is film thickness and the mean free path $\lambda$ is 35.8 nm at room temperature according to C. Kittel, Introduction to solid state physics, Wiley, N.Y., 5th edition, 1976.

In particular embodiments, the conductive layer can have a normalized thickness of no greater than about 5.0, no greater than about 4.0, no greater than about 3.0, no greater than about 2.5, no greater than about 2.0, no greater than about 1.75, no greater than about 1.5, no greater than about 1.25, no greater than about 1.0, or even no greater than about 0.75. In further embodiments, the conductive layer can have a normalized thickness of at least about 0.01, at least about 0.1, or even at least about 0.2. Moreover, the conductive layer can have a normalized thickness in a range of any of the minimums and maximums provided above, such as in a range of from about 0.01 to about 5.0, or even from about 0.1 to about 3.0.

The conductive thin film composites according to embodiments of the present disclosure can contain unparalleled features such as unparalleled resistivity, abrasion resistance, adhesion, density, and corrosion resistance. Heretofore, it was unknown how to form a conductive composite having the following recited resistivity, abrasion resistance, adhesion, density, and corrosion resistance at such low thickness described herein.

As described herein the conductive thin film composites have an excellent conductivity, as demonstrated by a low resistivity. Resistivity is an intrinsic property that quantifies how strongly a given material opposes the flow of electric current. A low resistivity indicates a material that readily allows the movement of electric charge. As used herein, resistivity is calculated by multiplying the sheet resistance by the film thickness, where the thickness is measured by inductively coupled plasma optical emission spectrometry (ICP-OES) as is well understood in the art.

Accordingly, in particular embodiments, the conductive composite can have a resistivity of no greater than about 65 ohm·nm, no greater than about 63 ohm·nm, no greater than about 61 ohm·nm, no greater than about 59 ohm·nm, no greater than about 57 ohm·nm, no greater than about 55 ohm·nm, no greater than about 50 ohm·nm, no greater than about 40 ohm·nm, no greater than about 35 ohm·nm, or even no greater than about 30 ohm·nm. In further embodiments, the conductive composite can have a resistivity of at least about 25 ohm·nm, at least about 30 ohm·nm, or even at least about 35 ohm·nm. Moreover, the conductive composite can have a resistivity in a range of any of the minimums and maximums provided above, such as in a range of from about 30 ohm·nm to about 100 ohm·nm, or even from about 40 ohm·nm to about 80 ohm·nm.

As the resistivity can vary on thickness, and particularly at very low thickness of the conductive layer, the resistivity can be presented as an equation as a function of thickness. For example, certain embodiments, the conductive composite can have a resistivity of no greater than about $97.077t^{-0.071}$ ohm·nm, where t represents the thickness of the conductive layer in nanometers. In further embodiments, the conductive composite can have a resistivity of no greater than about 5% less, 10% less, 15% less, or even 20% less than $97.077t^{-0.071}$ ohm·nm, where t represents the thickness of the conductive layer in nanometers.

Another way to describe the composite's conductive performance is to evaluate the sheet resistance of the composite. The utility of sheet resistance as opposed to resistivity is that it is directly measured using a four-terminal sensing measurement (also known as a four-point probe measurement). Sheet resistance is invariable under scaling of the composite contact and therefore can be used to compare the electrical properties of composites that are significantly different in size. As used herein, sheet resistance is directly measured using a four-terminal sensing measurement (also known as a four-point probe measurement) as is well understood in the art.

As the sheet resistance can vary on thickness, and particularly at very low thickness of the conductive layer, the sheet resistance can be presented as an equation as a function of thickness. For example, certain embodiments, the conductive composite can have a sheet resistance of no greater than about $97.077t^{-1.071}$ ohm/sq, where t represents the thickness of the conductive layer in nanometers. In further embodiments, the conductive composite can have a sheet resistance of no greater than about 5% less, 10% less, 15% less, or even 20% less than $97.077t^{-1.071}$ ohm/sq where t represents the thickness of the conductive layer in nanometers.

Accordingly, in particular embodiments, the conductive composite can have a sheet resistance of no greater than about 30 ohm/sq, no greater than about 20 ohm/sq, no greater than about 10 ohm/sq, no greater than about 5 ohm/sq, no greater than about 4 ohm/sq, no greater than about 3 ohm/sq, no greater than about 2 ohm/sq, no greater than about 1 ohm/sq, or even no greater than about 0.5 ohm/sq. In further embodiments, the conductive composite can have a sheet resistance of at least about 0.01 ohm/sq, or even at least about 0.1 ohm/sq. Moreover, the conductive composite can have a sheet resistance in a range of any of the minimums and maximums provided above, such as in a range of from about 0.01 ohm/sq to about 50 ohm/sq, or even from about 0.1 ohm/sq to about 10 ohm/sq.

The conductive composite according to certain embodiments can also have a desirably improved corrosion resistance. Typically, conductive thin film composites suffer from corrosion over time which can increase the resistivity of the composite and thereby impair the conductive performance. Moreover, attempts to reduce the thickness of the composite only resulted in impairing the composite's corrosion resistance. In contrast, the current inventors surprisingly discovered that the conductive composites described herein can exhibit an unparalleled corrosion resistance at the low thicknesses described herein.

As used herein, electrical stability is determined by measuring the sheet resistance change after aging at room temperature for a specified time interval. The sheet resistance is measured as described above, i.e. with a 4-point probe.

Accordingly, in certain embodiments, the conductive composite can have a sheet resistance change after aging at room temperature for 1 day, 7 days, 30 days, 3 months, 6 months, or even 1 year of no greater than about 40%, no greater than about 30%, no greater than about 20%, no greater than about 10%, no greater than about 5%, or even no greater than about 3%.

Another improvement in particular embodiments of the conductive composites described herein is an increased density of the conductive layer. For example, in particular embodiments, the conductive layer can have a density of at least about 8 g/cm$^3$, at least about 9 g/cm$^3$, or even at least about 9.5 g/cm$^3$. In further embodiments, the conductive layer can have a density of no greater than about 19.3 g/cm$^3$, no greater than about 19 g/cm$^3$, or even no greater than about 18.5 g/cm$^3$. Moreover, the conductive layer can have a density in a range of any of the minimums and maximums provided above, such as in a range of from about 9.5 g/cm$^3$ to about 18.5 g/cm$^3$.

Another way to describe the density improvement is to calculate a normalized density. The normalized density is determined by dividing the film density by the bulk density. The bulk density of the conductive material(s) in the conductive layer can be found in, for example, Cutnell, John D. and Kenneth W. Johnson. Physics 4th Edition. New York: Wiley. 1998: 308. As a particular example, the bulk density of gold is 19.30 g/cm$^3$.

Accordingly, in particular embodiments, the conductive layer can have a normalized density of at least about 0.6, at least about 0.65, at least about 0.7, or even at least about 0.75. In further embodiments, the conductive layer can have a normalized density of no greater than about 0.99, no greater than about 0.95, or even no greater than about 0.90. Moreover, the conductive layer can have a normalized density in a range of any of the minimums and maximums provided above, such as in a range of from about 0.75 to about 0.90.

Yet another improvement in particular embodiments of the conductive composites described herein is an improved abrasion resistance. Abrasion resistance is a measure of the composites ability to resist scratching. As used herein, abrasion resistance is measured according to sheet resistance change after abrasion. Once abraded, a conductive composite can lose conductive performance. Typically, prior attempts to lower the thickness of the conductive layer resulted in impairing the abrasion resistance of the conductive composite. In contrast, the present inventors surprisingly discovered a conductive composite construction in which the desired abrasion resistance was maintained despite lowering the thickness of the conductive layer.

A tuber Abraser, for example model 5130, can be used to test the abrasion resistance of the conductive film by monitoring the sheet resistance change instead of haze change, following similar procedure of Taber Abrasion ASTM D1044 (Haze). Accordingly, in particular embodiments, the conductive layer can have an abrasion resistance rating of at least about 0.5% sheet resistance change per cycle of 250 gram load. In further embodiments, the conductive layer can have an abrasion resistance rating of no greater than about 50% sheet resistance change per cycle of 250 gram load. Moreover, the conductive layer can have an abrasion resistance rating in a range of any of the minimums and maximums provided above, such as in a range of sheet resistance change from about 3% to about 10% per cycle of 250 gram load.

Yet another improvement in particular embodiments of the conductive composites described herein is an improved scratch resistance. Scratch resistance is another measure of the composites ability to resist scratching. As used herein, scratch resistance is measured using an Erichsen Hardness Test Pencil, for example model 308S. The conductive layer of the composite film is scratched using the pencil under a 0.5 N load. The scratch resistance for the conductive composite is reported as the width of the scratch on the composite as measured using a microscope. Improved scratch resistance is demonstrated though a narrower scratch width.

Accordingly, in particular embodiments, the conductive layer can have a scratch resistance of not greater than 87 microns in width. In further embodiments, the conductive layer can have a scratch resistance of not greater than 86 microns in width. Moreover, the conductive layer can have a scratch resistance of not greater than 85 microns in width.

It should be noted that the scratch resistance of an electrode may be relevant to the performance of a biosensor device because, when used, a biosensor may be inserted into a digital reader system and the electrode may perform an electrical contact with metallic pins in the digital reader system. If the metallic pins create a scratch on the biosensor electrode when the biosensor is inserted into the digital reader, false readings or a non-measurement may occur.

A still further improvement of certain embodiments of the conductive composite described herein is an improved adhesion of the conductive layer to the substrate. Typically, conductive thin film composites suffered from delamination of the conductive layer from the substrate. Further, attempts to decrease the thickness of the conductive layer only deteriorated the adhesion of the conductive layer to the substrate. In contrast, the current inventors surprisingly discovered that the conductive composites according to embodiments of the present disclosure can exhibit improved adhesion to the substrate, even while lowering the thickness to the ranges described herein.

As used herein, adhesion is measured according to ASTM D 3359 Method B (crosshatch). In particular, a user makes 90 degree crosshatch patterns on film side first then applies ASTM Part Number 11327-02563 #51596 tape firmly on crosshatch grid areas with 60 seconds duration, then pulls off tape at approximately 120 degree at a rate about 2 seconds. Clarification for acceptance per ASTM 3359-02 Class 4B (less than 5% of area removed). Surprisingly, very thin conductive layers have been found to have at least a Class 5B (none area removed) adhesion ranking, much better than previously obtainable.

Figure 2:
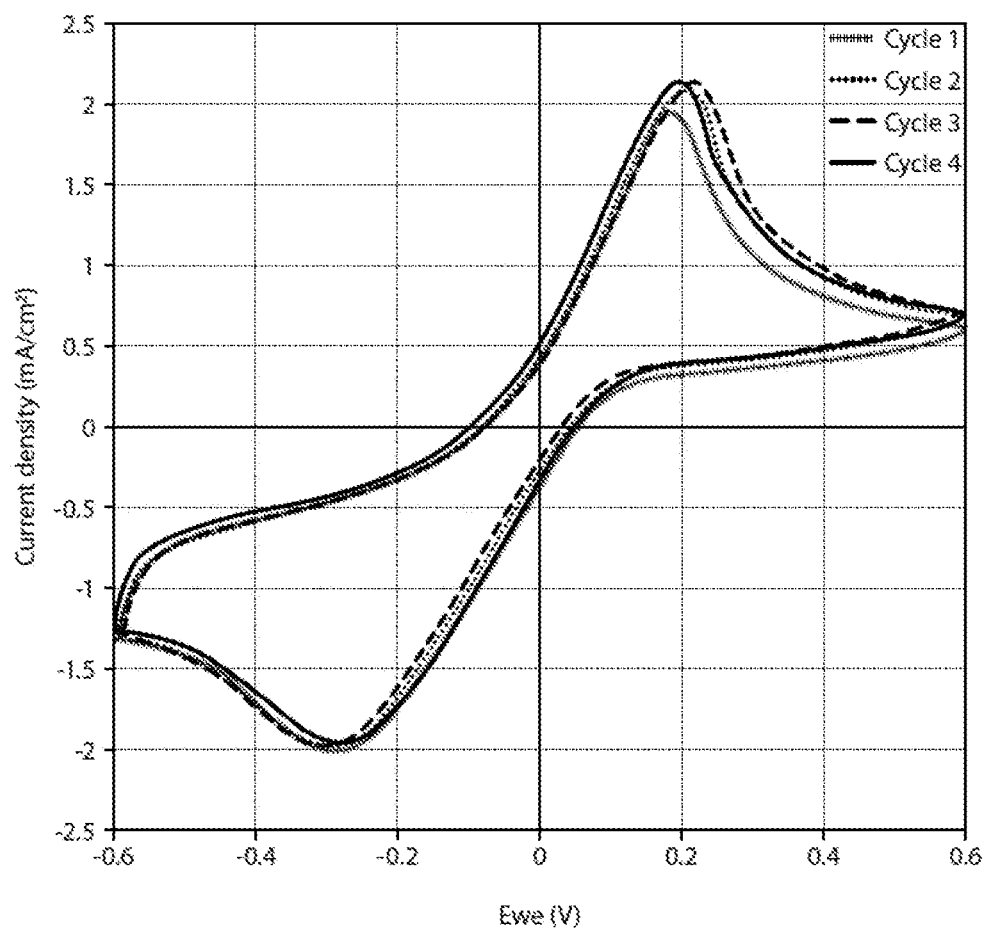
FIG. 2 includes an illustration of a four-cycle cyclic voltammogram of a 31.2 nm Au film, where reversible and repeatable oxidation and reduction processes are demonstrated.

Still yet another improvement of certain embodiments of the conductive composite described herein is improved electrochemical characteristics. To quantify the electrochemical performance of a conductive composite, multiple cyclic voltammetry (CV) scans can be performed and the results analyzed to determine shifts in the current density and potential of oxidation peaks. Embodiments of the present disclosure exhibit a novel % shifts in the current density and potential of oxidation peaks after multiple cyclic voltammetry scans. As used herein, CV is performed by cycling the potential of a working electrode (Au film) against a reference electrode which maintained a constant potential, and measuring the resulting current. For example, a four-cycle cyclic voltammogram of a 31.2 nm Au film is plotted in FIG. 2, where reversible and repeatable oxidation and reduction processes are demonstrated and can be adopted in biosensor applications.

For example, in particular embodiments, the conductive composite can have shifts in the current density and potential of oxidation peaks after 2, 3, 4, 5, 10, or even 100 cycles of no greater than about 40%, no greater than about 30%, no greater than about 20%, no greater than about 10%, no greater than about 5%, or even no greater than about 3% as shown in Voltammograms and as measured during multiple cyclic voltammetry scans.

The thin conductive composite described herein can be useful in many different applications, including for example, a biosensor, as a window film layer, as well as additional applications where high and robust electrical performances are desired at very low thickness.

EXAMPLES

Example 1

A plurality of sample thin film conductive composites were created and tested. In general, a Melinex Polyester Film (PET) substrate from the DuPont Teijin Films was provided and a conductive layer was sputtered onto the substrate in a roll-to-roll process. The plurality of samples had the following depositions parameters. The samples were then tested for various properties including resistivity, sheet resistance, and thickness. The test methods for measuring these characteristics are described in detail herein. The following results were obtained:

TABLE 1

Deposition Parameters for Example 1

| Samples | Kr/(Kr + Ar) % | Power kW | Pressure mbar | Thickness nm | Rs ohm/sq | Resistivity ohm · nm |
|---|---|---|---|---|---|---|
| 1 | 0 | 3.4 | 2.8 | 10.8 | 7.9 | 78.4 |
| 2 | 0 | 6.2 | 2.8 | 19.2 | 4.0 | 75.2 |
| 3 | 0 | 10.4 | 2.8 | 31.3 | 2.4 | 74.1 |
| 4 | 0 | 21.0 | 2.8 | 61.1 | 1.2 | 75.1 |
| 5 | 0 | 28.0 | 2.8 | 80.4 | 0.9 | 72.3 |
| 6 | 0 | 34.8 | 2.8 | 99.8 | 0.7 | 75.8 |
| 7 | 100 | 2.8 | 3.4 | 10.7 | 6.9 | 67.0 |
| 8 | 100 | 5.0 | 3.4 | 18.9 | 2.8 | 52.5 |
| 9 | 100 | 8.4 | 3.4 | 31.2 | 1.4 | 43.4 |
| 10 | 100 | 16.8 | 3.4 | 69.7 | 0.6 | 37.5 |
| 11 | 100 | 22.4 | 3.4 | 81.2 | 0.4 | 36.8 |
| 12 | 100 | 28.0 | 3.4 | 101.8 | 0.3 | 36.7 |
| 13 | 25 | 28.2 | 2.9 | 89.8 | 0.7 | 67.7 |
| 14 | 50 | 25.8 | 3.1 | 88.2 | 0.6 | 59.0 |
| 15 | 75 | 26.8 | 3.3 | 95.0 | 0.5 | 50.8 |

Figure 3:
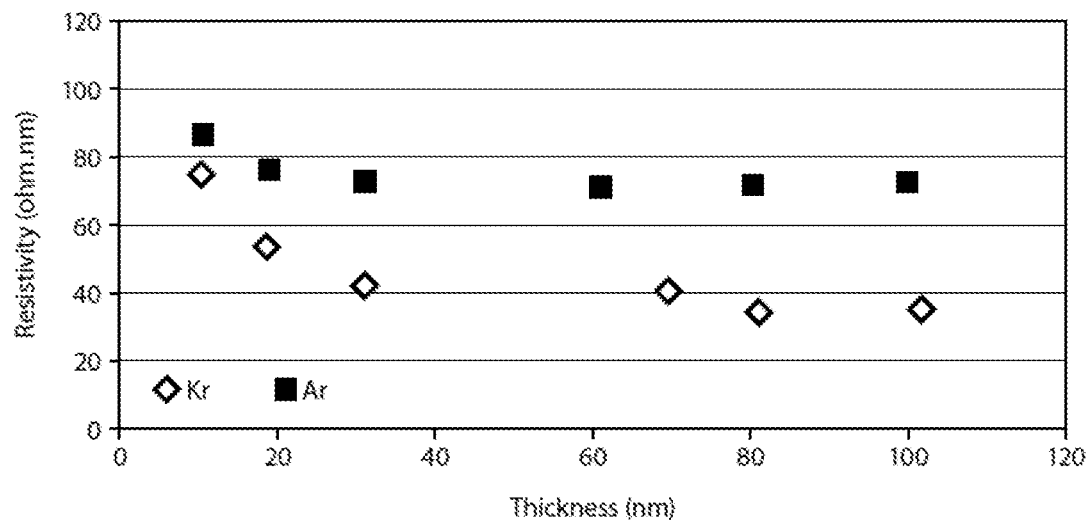
FIG. 3 illustrates a plot of the thickness of the conductive layer in nanometers versus the resistivity according to Example 1 of the present disclosure.

The results described above are also graphically represented in the Figures. In particular, FIG. 3 illustrates a plot of the thickness of the conductive layer in nanometers versus the resistivity. As illustrated, use of krypton as the sputtering gas greatly improved the resistivity of the composite across the thicknesses tested.

Figure 4:
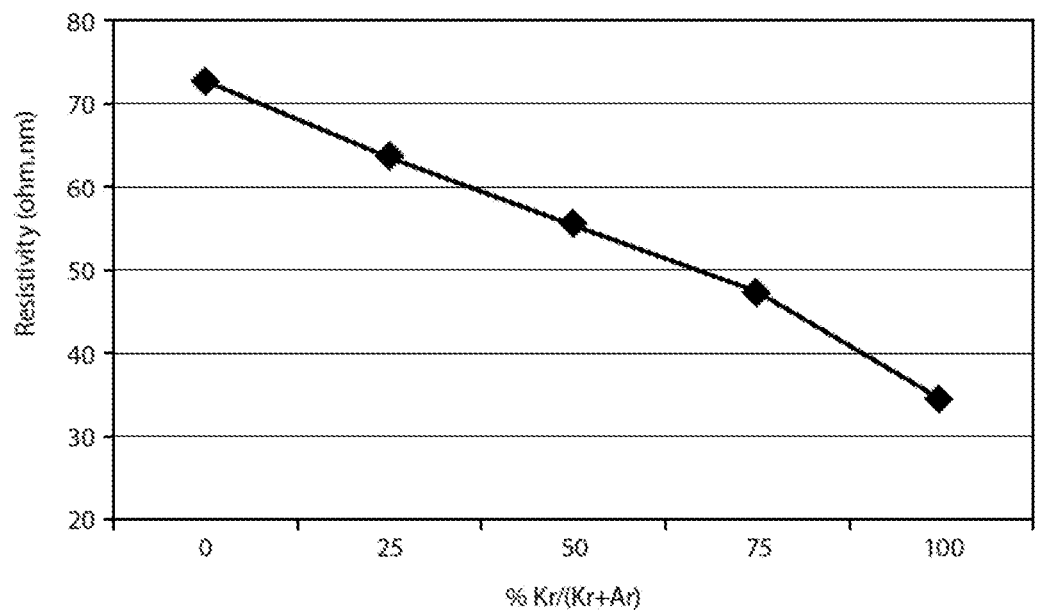
FIG. 4 illustrates a plot of the resistivity of the composite versus the Krypton volume fraction according to Example 1 of the present disclosure.

FIG. 4 illustrates a plot of the resistivity of the composite versus the Krypton volume fraction. As illustrate, krypton content greatly improved resistivity.

Figure 5:
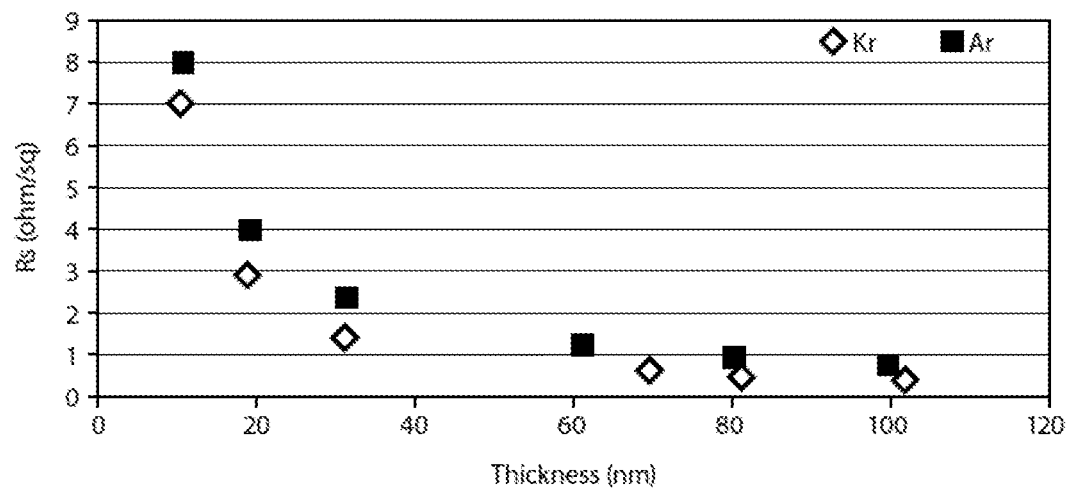
FIG. 5 illustrates a plot of thickness versus the sheet resistance according to Example 1 of the present disclosure.

FIG. 5 illustrates a plot of thickness versus the sheet resistance. As illustrated, use of krypton as the sputtering gas greatly improved the sheet resistance.

Example 2

A plurality of sample thin film conductive composites were created and tested. In general, a Melinex Polyester Film (PET) substrate from the DuPont Teijin Films was provided and a conductive layer was sputtered onto the substrate in a roll-to-roll process. The conductive layers in samples 16, 17, 18 and 19 were sputtered using argon as a sputtering gas. The conductive layers in samples 20, 21, 22 and 23 were sputtered using krypton as a sputtering gas. The thickness of the conductive layers for each sample is provided below. The samples were then tested for scratch resistance using an Erichsen Hardness Test Pencil, Model 308S, applied under a 0.5 N load. The width or each scratch was measured under a microscope and the following results were obtained:

TABLE 2

Scratch Test Parameters and Results for Example 2

| Samples | Conductive Layer Thickness Nm | Scratch Width μm | SW Stdev |
|---|---|---|---|
| 16 | 6.8 | 93.45 | 5.5 |
| 17 | 15.8 | 95.91 | 4.61 |
| 18 | 29.5 | 87.39 | 4.26 |
| 19 | 49.7 | 92.4 | 4.83 |
| 20 | 5.7 | 82.16 | 6.16 |
| 21 | 14.3 | 79.6 | 3.53 |
| 22 | 29.5 | 84.46 | 5.10 |
| 23 | 48.6 | 83.63 | 6.53 |

Figure 6:
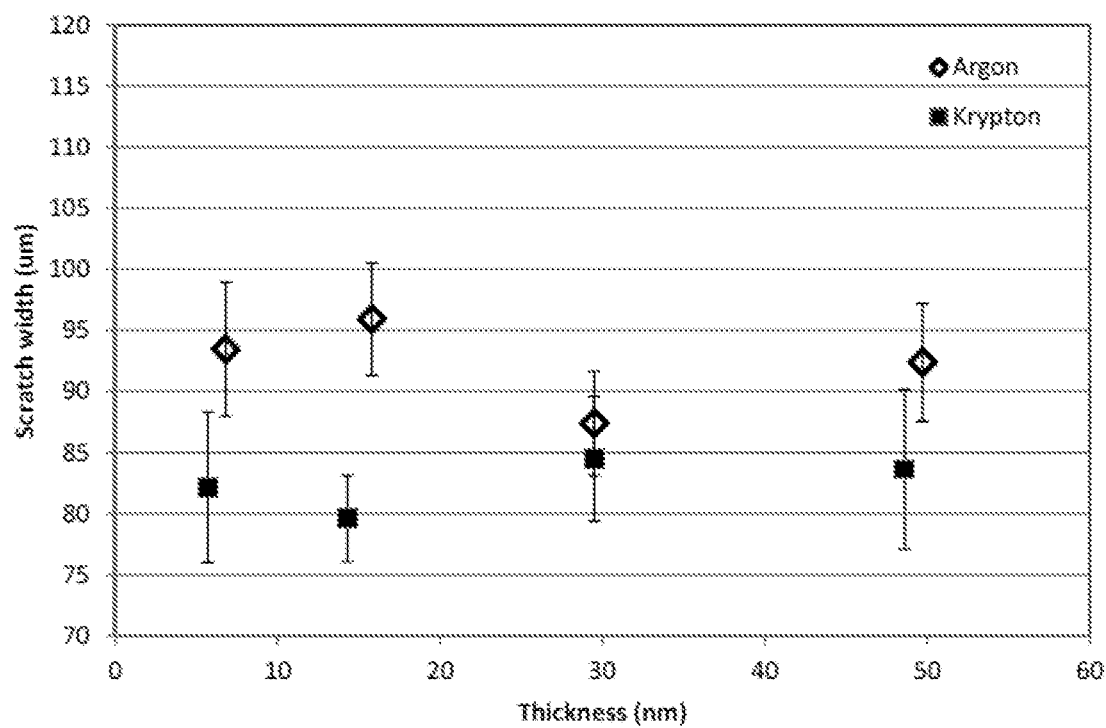
FIG. 6 illustrates a plot of thickness versus the scratch width according to Example 2 of the present disclosure.

The results described above are also graphically represented in the Figures. In particular, FIG. 6 illustrates a plot of the thickness of the conductive layer in nanometers versus the scratch width for each sample. As illustrated, use of krypton as the sputtering gas greatly reduced the scratch width at all conductive layer thicknesses, indicating improved scratch resistance for the film.

Many different aspects and embodiments are possible. Some of those aspects and embodiments are described below. After reading this specification, skilled artisans will appreciate that those aspects and embodiments are only illustrative and do not limit the scope of the present invention. Embodiments may be in accordance with any one or more of the items as listed below.

Embodiment 1. A biosensor electrode comprising:
a. a polymeric film substrate; and
b. a conductive layer disposed adjacent the substrate;
c. wherein the conductive layer comprises Krypton and a conductive material;
d. wherein the conductive layer has an average thickness of no greater than about 150 nanometers;
e. wherein the conductive layer has a normalized thickness (t/λ) of no greater than about 3.0; and
f. wherein the composite has a sheet resistance of no greater than about $97.077t^{-1.071}$ ohm/sq, where t represents the thickness of the conductive layer in nanometers.

Embodiment 2. A biosensor electrode comprising:
a. a polymeric film substrate; and
b. a conductive layer disposed adjacent the substrate;
c. wherein the conductive layer comprises Krypton and a conductive material;
d. wherein the conductive layer has a resistivity of no greater than about $97.077t^{-0.071}$ ohm·nm; and
e. wherein the composite has a sheet resistance of no greater than about $97.077t^{-1.071}$ ohm/sq, where t represents the thickness of the conductive layer in nanometers.

Embodiment 3. A method of forming a biosensor electrode, the method comprising:
a. providing a substrate layer;
b. forming a conductive layer via a sputtering technique using a sputtering gas comprising krypton;
c. wherein the conductive layer has an average thickness of no greater than about 150 nanometers;
d. wherein the conductive layer has a normalized thickness (t/λ) of no greater than about 3.0; and
e. wherein the composite has a sheet resistance of no greater than about $97.077t^{-1.071}$ ohm/sq, where t represents the thickness of the conductive layer in nanometers.

Embodiment 4. A composite comprising:
a. a substrate; and
b. a conductive layer disposed adjacent the substrate;
c. wherein the conductive layer comprises sputtered atoms from a sputtering gas and a conductive material;
d. wherein the conductive layer has a thickness of no greater than about 150 nanometers;
e. wherein the sputtered atoms from a sputtering gas are present in the conductive layer in an amount of at least about $1\times10^5$ Atoms/cm$^3$ at a depth of about 5 nanometers as measured according to SIMS, and
f. wherein the composite has a sheet resistance of no greater than about 0.3 ohms/sq.

Embodiment 5. A composite comprising:
a. a substrate; and
b. a conductive layer disposed adjacent the substrate;
c. wherein the conductive layer has a thickness of no greater than about 150 nanometers;

d. wherein the conductive layer comprises sputtered atoms from a sputtering gas and a conductive material;
e. wherein the composite has at least two of the following characteristics:
  i. the conductive layer has a normalized thickness (t/λ) of no greater than about 3.0; and
  ii. the composite has a sheet resistance of no greater than about $97.077t^{-1.071}$ ohm/sq, where t represents the thickness of the conductive layer in nanometers;
  iii. the sputtered atoms from a sputtering gas are present in the conductive layer in an amount of at least about $1\times10^5$ Atoms/cm$^3$ at a depth of about 5 nanometers as measured according to SIMS;
  iv. the composite has a resistivity of no greater than about 65 ohm·nm;
  v. the composite has a sheet resistance change after aging at room temperature for 3 months of no greater than about 30% as measured according to 4-point probe;
  vi. the composite has shifts in the current density and potential of oxidation peaks after 10 cycles of no greater than about 30% as shown in Voltammograms and as measured during multiple cyclic voltammetry scans;
  vii. the conductive layer has a normalized density of at least about 9.5 g/cm$^3$;
  viii. the conductive layer has an abrasion resistance of no greater than about 50% sheet resistance change per cycle of 250 gram load;
  ix. the conductive layer has a peel strength of at least about 5 B as measured according to a crosshatch measurement.

Embodiment 6. The biosensor electrode, composite, or method of any one of the preceding embodiments, wherein the conductive layer has a thickness of at least about 0.1 nanometers, at least about 0.5 nanometers, at least about 1 nanometer, at least about 3 nanometers, at least about 5 nanometers, or even at least about 10 nanometers.

Embodiment 7. The biosensor electrode, composite, or method of any one of the preceding embodiments, wherein the conductive layer has a thickness of no greater than about 150 nanometers, no greater than about 125 nanometers, no greater than about 100 nanometers, no greater than about 80 nanometers, no greater than about 70 nanometers, no greater than about 60 nanometers, no greater than about 50 nanometers, no greater than about 40 nanometers, no greater than about 30 nanometers, no greater than about 25 nanometers, or even no greater than about 20 nanometers.

Embodiment 8. The biosensor electrode, composite, or method of any one of the preceding embodiments, wherein the conductive layer has a thickness in a range of from about 3 nanometers to about 150 nanometers, or even from about 5 nanometers to about 100 nanometers.

Embodiment 9. The biosensor electrode, composite, or method of any one of the preceding embodiments, wherein the conductive layer has a normalized thickness of no greater than about 5.0, no greater than about 4.0, no greater than about 3.0, no greater than about 2.5, no greater than about 2.0, no greater than about 1.75, no greater than about 1.5, no greater than about 1.25, no greater than about 1.0, or even no greater than about 0.75.

Embodiment 10. The biosensor electrode, composite, or method of any one of the preceding embodiments, wherein the conductive layer has a normalized thickness of at least about 0.01, at least about 0.1, or even at least about 0.2.

Embodiment 11. The biosensor electrode, composite, or method of any one of the preceding embodiments, wherein the conductive layer has a normalized thickness in a range of from about 0.01 to about 5.0, or even from about 0.1 to about 3.0.

Embodiment 12. The biosensor electrode, composite, or method of any one of the preceding embodiments, wherein the conductive material comprises aluminum, carbon (such as graphite), cobalt, copper, gold, indium, iridium, iron, magnesium, nickel, niobium, osmium, palladium, platinum, rhenium, rhodium, selenium, silver, tantalum, tin, titanium, tungsten, vanadium, zirconium, mixtures thereof, or alloys, oxides, or metallic compounds of these elements.

Embodiment 13. The biosensor electrode, composite, or method of any one of the preceding embodiments, wherein the conductive material comprises a metal.

Embodiment 14. The biosensor electrode, composite, or method of any one of the preceding embodiments, wherein the conductive material comprises gold (AU).

Embodiment 15. The biosensor electrode, composite, or method of any one of the preceding embodiments, wherein the conductive layer comprises krypton.

Embodiment 16. The biosensor electrode, composite, or method of any one of the preceding embodiments, wherein the conductive layer comprises krypton and at least one of Argon, Xenon, Neon, or a combination thereof.

Embodiment 17. The biosensor electrode, composite, or method of any one of the preceding embodiments, wherein the conductive layer consists essentially of the conductive material and krypton.

Embodiment 18. The biosensor electrode, composite, or method of any one of the preceding embodiments, wherein the conductive layer consists essentially of krypton.

Embodiment 19. The biosensor electrode, composite, or method of any one of the preceding embodiments, wherein krypton is present in the conductive layer in an amount of at least about $1\times10^{10}$ Atoms/cm$^3$, at least about $1\times10^{12}$ Atoms/cm$^3$, at least about $1\times10^{14}$ Atoms/cm$^3$, at least about $1\times10^{16}$ Atoms/cm$^3$, at least about $1\times10^{18}$ Atoms/cm$^3$, or even at least about $1\times10^{19}$ Atoms/cm$^3$ at a depth of about 5 nanometers, about 10 nanometers, about 20 nanometers, about 30 nanometers, about 40 nanometers, about 50 nanometers, about 60 nanometers, or even about 70 nanometers as measured according to SIMS.

Embodiment 20. The biosensor electrode, composite, or method of any one of the preceding embodiments, wherein the composite has a sheet resistance of no greater than about $97.077t^{-1.071}$ ohm/sq, where t represents the thickness of the conductive layer in nanometers.

Embodiment 21. The biosensor electrode, composite, or method of any one of the preceding embodiments, wherein the composite has a sheet resistance of no greater than about 5% less, 10% less, 15% less, or even 20% less than $97.077t^{-1.071}$ ohm/sq, where t represents the thickness of the conductive layer in nanometers.

Embodiment 22. The biosensor electrode, composite, or method of any one of the preceding embodiments, wherein the composite has a sheet resistance of no greater than about 30 ohm/sq, no greater than about 20 ohm/sq, no greater than about 10 ohm/sq, no greater than about 5 ohm/sq, no greater than about 4 ohm/sq, no greater than about 3 ohm/sq, no greater than about 2 ohm/sq, no greater than about 1 ohm/sq, or even no greater than about 0.5 ohm/sq.

Embodiment 23. The biosensor electrode, composite, or method of any one of the preceding embodiments, wherein the composite has a sheet resistance of at least about 0.01 ohm/sq, or even at least about 0.1 ohm/sq.

Embodiment 24. The biosensor electrode, composite, or method of any one of the preceding embodiments, wherein the composite has a sheet resistance in a range of from about 0.01 ohm/sq to about 50 ohm/sq, or even from about 0.1 ohm/sq to about 10 ohm/sq.

Embodiment 25. The biosensor electrode, composite, or method of any one of the preceding embodiments, wherein the composite has a resistivity of no greater than about $97.077t^{-0.071}$ ohm·nm, where t represents the thickness of the conductive layer in nanometers.

Embodiment 26. The biosensor electrode, composite, or method of any one of the preceding embodiments, wherein the composite has a resistivity of no greater than about 5% less, 10% less, 15% less, or even 20% less than $97.077t^{-0.071}$ ohm·nm, where t represents the thickness of the conductive layer in nanometers.

Embodiment 27. The biosensor electrode, composite, or method of any one of the preceding embodiments, wherein the composite has a resistivity of no greater than about 65 ohm·nm, no greater than about 63 ohm·nm, no greater than about 61 ohm·nm, no greater than about 59 ohm·nm, no greater than about 57 ohm·nm, no greater than about 55 ohm·nm, no greater than about 50 ohm·nm, no greater than about 40 ohm·nm, no greater than about 35 ohm·nm, or even no greater than about 30 ohm·nm.

Embodiment 28. The biosensor electrode, composite, or method of any one of the preceding embodiments, wherein the composite has a resistivity of at least about 25 ohm·nm, at least about 30 ohm·nm, or even at least about 35 ohm·nm.

Embodiment 29. The biosensor electrode, composite, or method of any one of the preceding embodiments, wherein the composite has a resistivity in a range of from about 30 ohm·nm to about 100 ohm·nm, or even from about 40 ohm·nm to about 80 ohm·nm.

Embodiment 30. The biosensor electrode, composite, or method of any one of the preceding embodiments, wherein the composite has a sheet resistance change after aging at room temperature for 1 day, 7 days, 30 days, 3 months, 6 months, or even 1 year of no greater than about 40%, no greater than about 30%, no greater than about 20%, no greater than about 10%, no greater than about 5%, or even no greater than about 3% as measured according to 4-point probe.

Embodiment 31. The biosensor electrode, composite, or method of any one of the preceding embodiments, wherein the composite has shifts in the current density and potential of oxidation peaks after 2, 3, 4, 5, 10, or even 100 cycles of no greater than about 40%, no greater than about 30%, no greater than about 20%, no greater than about 10%, no greater than about 5%, or even no greater than about 3% as shown in Voltammograms and as measured during multiple cyclic voltammetry scans.

Embodiment 32. The biosensor electrode, composite, or method of any one of the preceding embodiments, wherein the conductive layer has a density in a range of from about 9.5 g/cm³ to about 18.5 g/cm³.

Embodiment 33. The biosensor electrode, composite, or method of any one of the preceding embodiments, wherein the conductive layer has an abrasion resistance in a range of from about 0.5% to about 50% sheet resistance change per cycle of 250 gram load.

Embodiment 34. The biosensor electrode, composite, or method of any one of the preceding embodiments, wherein the conductive layer has a peel strength of at least about 5 B as measured according to a crosshatch measurement under ASTM D 3359 Method B (crosshatch).

Embodiment 35. The biosensor electrode, composite, or method of any one of the preceding embodiments, wherein the composite consists essentially of the substrate layer and the conductive layer.

Embodiment 36. The biosensor electrode, composite, or method of any one of the preceding embodiments, wherein the substrate layer comprises a first outermost major surface of the composite; and wherein the conductive layer comprises a second outermost major surface of the composite.

Embodiment 37. The biosensor electrode, composite, or method of any one of the preceding embodiments, wherein the substrate layer is directly adjacent to the conductive layer, without an intervening layer therebetween.

Embodiment 38. The composite or device of any one of the preceding embodiments, wherein the substrate layer comprises a polymer.

Embodiment 39. The composite or device of any one of the preceding embodiments, wherein the substrate layer comprises a thermoplastic polymer.

Embodiment 40. The composite or device of any one of the preceding embodiments, wherein the substrate layer comprises a polyolefin.

Embodiment 41. The composite or device of any one of the preceding embodiments, wherein the substrate layer comprises a polyester, a polycarbonate, a polyimide, or a combination thereof.

Embodiment 42. The composite or device of any one of the preceding embodiments, wherein the substrate layer comprises a polyester.

Embodiment 43. The composite or device of any one of the preceding embodiments, wherein the substrate layer comprises PET.

Embodiment 44. The composite or device of any one of the preceding embodiments, wherein the substrate layer has a thickness of at least about 1 micron, at least about 12 microns, or even at least about 100 microns.

Embodiment 45. The composite or device of any one of the preceding embodiments, wherein the substrate layer has a thickness of no greater than about 500 microns, no greater than about 400 microns, or even no greater than about 350 microns.

Embodiment 46. The composite or device of any one of the preceding embodiments, wherein the substrate layer has a thickness in a range of from about 12 microns to about 500 microns, or even from about 100 microns to about 350 microns.

Embodiment 47. The method of any one of the preceding embodiments, wherein the sputtering gas comprises krypton and another noble gas, such as argon, xenon, neon, or combinations thereof.

Embodiment 48. The method of any one of the preceding embodiments, wherein the sputtering gas comprises krypton and Argon.

Embodiment 49. The method of any one of the preceding embodiments, wherein the sputtering gas comprises krypton in a volume fraction of at least about at least about 0.05, at least about 0.1, at least about 0.15, at least about 0.2, at least about 0.25, at least about 0.5, at least about 0.6, at least about 0.75, or even at least about 0.95 based on the total volume of the sputtering gas.

Embodiment 50. The method of any one of the preceding embodiments, wherein the sputtering gas consists essentially of krypton.

Embodiment 51. The method of any one of the preceding embodiments, wherein the conductive layer is formed continuously or semi-continuously.

Embodiment 52. The method of any one of the preceding embodiments, wherein the conductive layer is formed in a roll-to-roll continuous process.

Embodiment 53. A biosensor comprising the biosensor electrode or composite of any one of the preceding embodiments.

Embodiment 54. A test strip comprising the biosensor electrode or composite of any one of the preceding embodiments.

Embodiment 55. A blood-glucose test strip comprising the biosensor electrode or composite of any one of the preceding embodiments.

Embodiment 56. A blood-glucose monitoring system comprising a blood-glucose test strip comprising the biosensor electrode or composite of any one of the preceding embodiments.

Embodiment 57. The biosensor electrode, composite, or method of any one of the preceding embodiments, wherein the composite has a scratch resistance of no greater than 87 microns om scratch width at 0/5 N Erichsen Tester Load, no greater than 86 microns or even no greater than 85 microns.

Note that not all of the activities described above in the general description or the examples are required, that a portion of a specific activity may not be required, and that one or more further activities may be performed in addition to those described. Still further, the order in which activities are listed is not necessarily the order in which they are performed.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A biosensor electrode comprising a composite, wherein the composite comprises:
   a. a polymeric film substrate; and
   b. a conductive layer disposed adjacent the substrate;
   c. wherein the conductive layer comprises Krypton and a conductive material, wherein the conductive material comprises aluminum, gold, indium, iridium, niobium, osmium, platinum, rhenium, rhodium, selenium, silver, tantalum, tin, tungsten, zirconium, mixtures thereof, alloys of any of these elements, oxides of any of these elements, or metallic compounds of any of these elements;
   d. wherein the conductive layer has a thickness of no greater than about 150 nanometers,
   e. wherein the conductive layer has a scratch resistance of not greater than 87 microns,
   f. wherein the composite has resistivity of no greater than about $97.077t^{-1.071}$ ohm·nm, where t represents the thickness of the conductive layer in nanometers, and
   g. wherein krypton is present in the conductive layer in an amount of at least about $1\times10^{10}$ Atoms/cm$^3$ at a depth of 5 nanometers as measured according to SIMS, or wherein krypton is present in the conductive layer in an amount of at least about $1\times10^{10}$ Atoms/cm$^3$ at a depth of 20 nanometers as measured according to SIMS.

2. The composite of claim 1, wherein the conductive layer has a thickness of no greater than about 50 nanometers.

3. The composite of claim 1, wherein the conductive layer comprises krypton and at least one of argon, xenon, neon, or a combination thereof.

4. The composite of claim 1, wherein the conductive layer consists essentially of the conductive material and krypton.

5. The biosensor electrode of claim 1, wherein the conductive layer has a thickness of at least about 3 nanometers.

6. The biosensor electrode of claim 1, wherein the conductive layer has a thickness of no greater than about 40 nanometers.

7. The biosensor electrode of claim 1, wherein the conductive layer has a thickness in a range of from about 5 nanometers to about 100 nanometers.

8. The biosensor electrode of claim 1, wherein the conductive layer consists of the conductive material and krypton.

9. The biosensor electrode of claim 1, wherein the composite consists essentially of the substrate layer and the conductive layer.

10. The biosensor electrode of claim 1, wherein the substrate layer comprises a first outermost major surface of the composite; and wherein the conductive layer comprises a second outermost major surface of the composite.

11. The biosensor electrode of claim 1, wherein the substrate layer is directly adjacent to the conductive layer, without an intervening layer therebetween.

12. The biosensor electrode of claim 1, wherein the substrate layer comprises a thermoplastic polymer.

13. The biosensor electrode of claim 1, wherein the substrate layer comprises a polyolefin.

14. The biosensor electrode of claim 1, wherein the substrate layer comprises a polyester, a polycarbonate, a polyimide, or a combination thereof.

15. The biosensor electrode of claim 1, wherein the substrate layer comprises a polyester.

16. The biosensor electrode of claim 1, wherein the substrate layer comprises PET.

17. The biosensor electrode of claim 1, wherein the substrate layer has a thickness of at least about 1 micron.

18. The biosensor electrode of claim 1, wherein the substrate layer has a thickness in a range of from about 100 microns to about 350 microns.

* * * * *